(12) United States Patent
Fazakas

(10) Patent No.: US 8,003,894 B2
(45) Date of Patent: Aug. 23, 2011

(54) SOLDERING NEST FOR A BUS BAR

(76) Inventor: András Fazakas, Budapest (HU)

( * ) Notice: Subject to any disclaimer, the term of this patent is extended or adjusted under 35 U.S.C. 154(b) by 0 days.

(21) Appl. No.: 10/589,569

(22) PCT Filed: Feb. 16, 2005

(86) PCT No.: PCT/HU2005/000016
§ 371 (c)(1),
(2), (4) Date: Aug. 16, 2006

(87) PCT Pub. No.: WO2005/078873
PCT Pub. Date: Aug. 25, 2005

(65) Prior Publication Data
US 2007/0202716 A1    Aug. 30, 2007

(30) Foreign Application Priority Data
Feb. 16, 2004  (HU) .................. 0400420

(51) Int. Cl.
H05K 1/16 (2006.01)
(52) U.S. Cl. ........................ 174/260; 439/876
(58) Field of Classification Search .......... 174/260; 439/876
See application file for complete search history.

(56) References Cited

U.S. PATENT DOCUMENTS

| | | | | |
|---|---|---|---|---|
| 2,912,745 A | * | 11/1959 | Steigerwalt et al. | 29/849 |
| 3,744,129 A | | 7/1973 | Dewey | |
| 3,838,203 A | | 9/1974 | Brandlein et al. | |
| 3,969,815 A | * | 7/1976 | Hacke et al. | 29/853 |
| 4,001,490 A | * | 1/1977 | Lynch | 174/88 R |
| 4,791,391 A | * | 12/1988 | Linnell et al. | 333/184 |
| 5,065,283 A | * | 11/1991 | Adachi et al. | 361/775 |
| 6,372,998 B1 | | 4/2002 | Suzuki et al. | |

FOREIGN PATENT DOCUMENTS

JP    2005129498    5/2005

* cited by examiner

Primary Examiner — Ishwarbhai B Patel
(74) Attorney, Agent, or Firm — Fitch, Even, Tabin & Flannery; Norman N. Kunitz

(57) ABSTRACT

A soldering nest provided in a bus bar, having an aperture for the introduction of a terminal lead (40) to be soldered thereinto, and the introduction of the terminal lead may be effected from a first surface plane of the bus bar (10) and soldering may be effected from a second, opposite surface plane of the bus bar (10). The aperture is formed by a conical bore (20) which is perpendicular or approximately perpendicular to the surface plane of the bus bar (10) and whose cone angle is at least 30?. The apex of the conical bore (20) is oriented toward the first surface plane of the bus bar (10), and the conical bore (20) terminates in a circular aperture (21) whose diameter is slightly greater than the diameter of the terminal lead (40).

5 Claims, 1 Drawing Sheet

SOLDERING NEST FOR A BUS BAR

CROSS REFERENCE TO RELATED APPLICATION

This application is the National Stage filing under 35 U.S.C. 371 of International Application No. PCT/HU2005/000016, filed Feb. 16, 2006, and claims the priority of Hungarian patent application No. P0400420, filed Feb. 16, 2004, the subject matter of which is incorporated, in their entireties, by reference.

BACKGROUND OF THE INVENTION

The invention relates to a soldering nest for a bus bar, and may find primary use in power-current devices including semiconductors and in power-current control systems.

In power-current systems which utilize copper or brass bus bars to conduct currents of at least 10 A, semiconductor devices and the ends of connecting wires are joined to the bus bar by soldering. Based on the examination of defect statistics and manufacturing waste, it has been found that most of the defects occur at the locations of soldering. The defects may be divided into two main groups: defects of the semiconductor elements occurring during soldering or as a result thereof and defects which occur at the location of soldering because of an imperfect contact and which are noticeable only after a prolonged service.

In preparation of soldering, for the cylindrical elements to be soldered (wire ends or electrode terminal leads of semiconductors), in the flat bus bars cylindrical bores of a diameter greater than the wire diameter of the elements are provided. Occasionally, the bores are treated by galvanization. Thereafter the wire ends are placed into the bores before soldering. Heat is transmitted, usually with the interposition of molten soldering tin, by a soldering iron or other suitable soldering tool placed on that side of the bus bar which is opposite the location where the elements were introduced.

Problems are encountered because the bus bar is a good heat conductor and a heat transmission for an extended period is needed to obtain the required temperature through the bore or gap for suitably melting the soldering material. In case heat transmission occurs for a short period of time, no bond is obtained along a suitably large surface, and while some electric connection will be present, its transitional resistance will be large. This circumstance gives rise to defects—which manifest themselves only in the course of prolonged use—because the larger transitional resistance resulting from the smaller connecting area causes a local heat-up which further damages the contact, rendering the defect noticeable sooner or later. If the soldering iron is maintained in place for a longer period than necessary to obtain the suitable temperature, the terminal lead of the semiconductor is exposed for a long period to the effect of the greater heat and, as a consequence of the good heat conductivity, it is the semiconductor which will be adversely affected because of the prolonged high temperature. An optimal situation is highly uncertain and depends from many factors that are difficult to control.

It is an object of the invention to provide a soldering nest which results in a substantially more reliable and more easily obtainable bond between the bus bar and the cylindrical element to be soldered and where the heat affecting the semiconductor is more moderate.

SUMMARY OF THE INVENTION

For achieving the above-noted object, it has been recognized that the bore to be provided in the bus bar should be conical rather than cylindrical, and further, the wide side of the bore should be on that side of the bus bar which is opposite the side where the cylindrical element is to be introduced. The cone angle is at least 30°, expediently 50°-90°, and at the cone apex an aperture is provided which is loosely adapted to the diameter of the cylindrical element for permitting a ready introduction thereof.

According to an advantageous embodiment the aperture is a short cylindrical portion which changes into the widening cone.

The solution of the invention will be discussed in further detail by way of an example in conjunction with the drawing, where

DETAILED DESCRIPTION OF THE INVENTION

Figure 1:
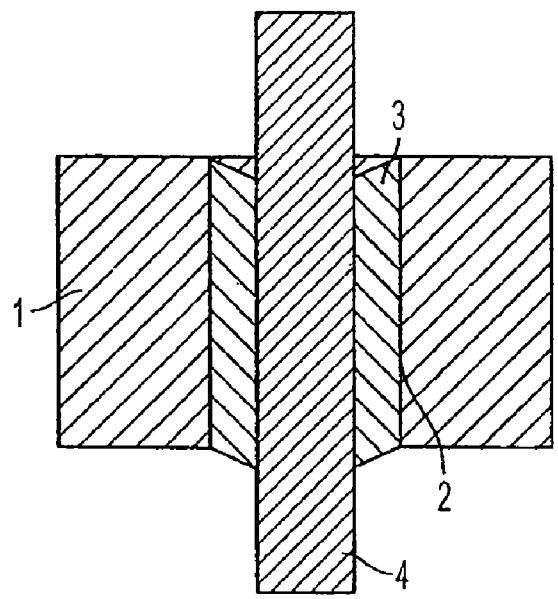
FIG. 1 is a schematic sectional view of a soldered joint according to the prior art and FIG. 2 is a sectional view of a soldering nest provided in a bus bar according to the invention.

FIG. 1 shows a conventional solution. The bus bar 1 is of a good electric and heat conducting material, such as copper, a copper alloy or silver, and contains a cylindrical soldering bore 2. A terminal lead 4 of a semiconductor device (not shown) may be fitted loosely into the soldering bore 2. The semiconductor terminal lead is cylindrical and is of a well-solderable material. Instead of the terminal lead 4, a wire end of similar diameter, but not belonging to a semiconductor may be joined to the bus bar 1. For purposes of a better demonstration the dimensions in FIG. 1 are exaggerated: in reality, the distance between the soldering bore 2 and the terminal lead 4 is less.

In certain cases the end of the terminal lead 4 projecting beyond the plane of the bus bar 1 is cut off. For performing the soldering, the hot soldering iron (not shown) is touched to that surface of the bus bar which is opposite to the semiconductor device, and between the bus bar plane and the soldering iron soldering tin is placed which melts and enhances heat transmission along a large area. Since the bus bar 1 is relatively thick and is a good heat conductor, the heat of the soldering iron spreads rapidly along a large surface. Transversely to the surface plane, however, the bus bar 1, particularly the side of the bore 2 oriented toward the semiconductor device, heats up relatively late. The speed of the heat-up is impeded by the fact that the semiconductor device cools the terminal lead 4 and furthermore, the molten tin is not capable of transmitting a suitable quantity of heat through the narrow gap between the terminal lead 4 and the bore 2. The technician performing the soldering operation keeps observing the outer surface of the bus bar 1 and upon seeing the tin melt and flow, concludes that the terminal lead 4 has satisfactorily bonded with the bus bar 1 and therefore removes the soldering iron and cools the bus bar with a coolant. Such a soldering may result in a bond between the bus bar 1 and the soldering material and between the latter and the terminal lead 4 solely in the uppermost small portion of the bore 2. Such a short bond cannot ensure a satisfactory electrical connection and furthermore, the mechanical strength of the bond is also insufficient. The electrical load may cause a local heat-up which results in a further deterioration of the bond and may lead to an even greater heat-up. In case the system or the semiconductor device is affected by mechanical forces or vibrations, the mechanical stress on the terminal lead 4 also weakens the solder. In case of a suitable soldering, the inside of the bore 2 is filled up by the soldering material 3 which, under the effect of surface tension, has a concave upper surface and a convex lower surface.

If the technician performing the soldering is familiar with the above-outlined problems and maintains the soldering iron in place for a period longer than necessary, an excessive heat-up of the bus bar 1 may expose the non-illustrated semiconductor device to overheating and thus may damage the same and likewise, any device which is soldered to the bus bar 1 in the vicinity of the bore 2 may be overheated.

Figure 2:
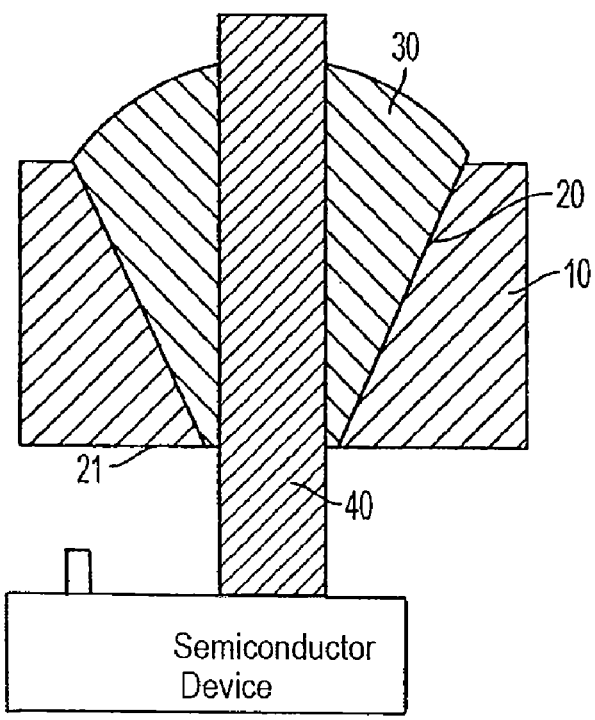

FIG. 2 illustrates the solution according to the invention, which provides a conical bore 20 in the bus bar 10. The semiconductor device to be soldered and its terminal lead 40 joins the bus bar 10 from the narrow end of the conical bore 20. The conical bore 20 has, at its end oriented toward the semiconductor device, a circular opening 21 which has a diameter similar to that of the bore 2 and which may join the conical bore 20 directly or by a short cylindrical portion (not shown). The cone angle of the conical bore 20 is expediently between 50°-90°; its size is not critical, but should be at least 30°.

In performing the soldering, the soldering iron is again approached from that side of the bus bar 10 which is opposite to the semiconductor device, but in this case a larger quantity of molten soldering tin may be placed under the soldering iron. The molten soldering tin cones into contact with the entire conical surface of the conical bore 20 and the molten soldering material 30 fills out the conical cavity in a few moments. Due to the large heat transferring surface, in the region of the terminal lead 40 and the bus bar 10, as well as in the region of the conical bore 20, the bus bar 10 heats up rapidly and reaches the temperature needed for soldering. At the same time, however, in the region of the narrow aperture 21, and because of the relatively cold bus bar 10 surrounding the aperture 21 and also because of the cooling effect of the semiconductor device, large heat quantities are not capable to pass through the bus bar 10 perpendicularly to its surface plane. Since the necessary period of contact between the soldering iron and the bus bar 10 is much shorter than in the solution according to FIG. 1, after removal of the soldering iron, the lesser heated bus bar 10 cools the soldering tin and the cooling manifests itself mostly at the side near the apex of the cone. The cooling speed may be increased by applying a coolant from the side of soldering.

The inner surfaces of the conical bore 20 and the soldering material 30 are substantially larger than the inner surface of the cylindrical bore 2, and the large surface assumes in its entirety the temperature needed for soldering; further, a uniform soldered bond of the terminal lead 40 along its entire length is also ensured. It is known that the soldering tin binds at the moment a required temperature and an oxide-free surface become available in the region of the adjacent surfaces. The large soldering space also enhances suitable results of the effect of the flux agents present in the soldering tin.

The soldering material 30 develops a convex top surface due to surface tension.

A comparison between the solution according to the prior art as illustrated in FIG. 1 and the solution according to the invention as illustrated in FIG. 2 has shown that, given identical dimensions, according to the invention the soldering material 30 is in contact at the bus bar 10 over an area which is more than twice the area of the bus bar 1 which the soldering material 3 contacts according to the prior art. Further, the solution according to the invention results in an elimination of the earlier-discussed problems and yields a significantly more advantageous bond.

Thus, by virtue of the described solution according to the invention, a rapid and high-quality bond is obtained which connects the bus bar 10 with the terminal lead 40 over a large area and at a small inner resistance. The heat-caused stresses on the semiconductor device are much less than in solutions using a conventional cylindrical bore 2. The obtained high-quality bond improves the short-term and long-term reliability particularly in applications which involve large currents and large mechanical loads.

The invention claimed is:

1. A soldering structure comprising:
    a bus bar made of a good heat conducting metal and having a pair of parallel planar surfaces with a predetermined uniform thickness defining an aperture extending across said thickness between said surfaces, said aperture having a conical wall with a central axis substantially normal to said planar surfaces and having a cone angle at least 30°, wherein said aperture has a smaller circular opening at a first one of said planar surfaces and a larger circular opening at a second opposite one of said planar surfaces; and
    a terminal lead of a semiconductor device inserted in said aperture of said bus bar through said smaller circular opening so as to extend substantially along said axis of said conical aperture between said first and second planar surfaces, with said semiconductor device facing said smaller circular opening and said first planar surface, and with the terminal lead ending at or beyond said second surface, wherein at most a small gap is provided between said terminal lead and said smaller circular opening; and,
    a soldering material substantially filling the space formed between said terminal lead and said smaller circular aperture, said soldering material being bonded both to said terminal lead and to said conical wall of said aperture.

2. The soldering structure as defined in claim 1, wherein the cone angle is between 50° and 90°.

3. The soldering structure as defined in claim 1, wherein the metal is copper, a copper alloy, or silver.

4. The soldering structure as defined in claim 1, wherein the bus bar is a stand-alone bus bar without contact, at least adjacent the conical bore, with a solid insulating material.

5. The soldering structure as claimed in claim 1, wherein the surface of said conical aperture wall is substantially larger than the surface of said terminal lead between said planar surfaces.

* * * * *